May 5, 1953
P. H. PETERS, JR
2,637,838
AMPLITUDE MODULATION CIRCUIT
Filed May 10, 1950
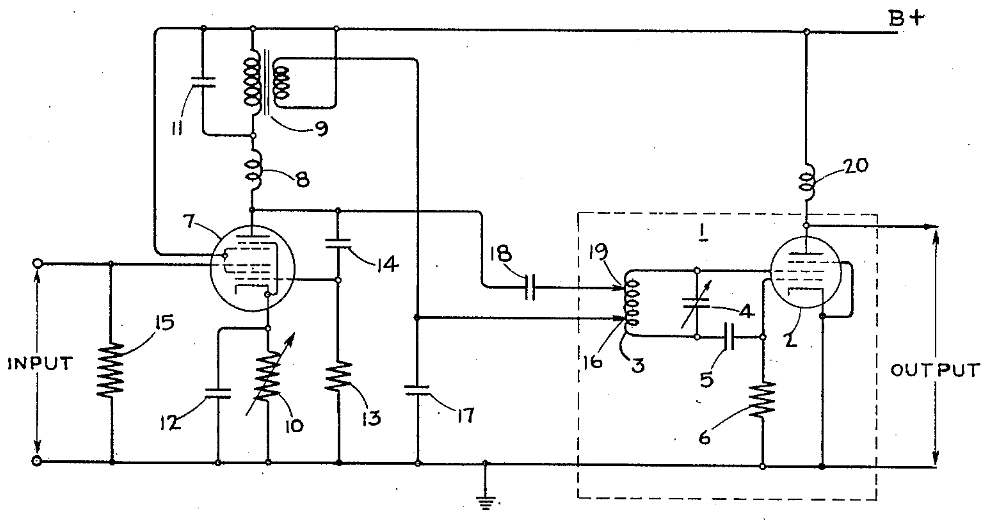
Inventor:
Philip H. Peters Jr.,
by Paul A. Frank
His Attorney.

Patented May 5, 1953 2,637,838

UNITED STATES PATENT OFFICE 2,637,838

AMPLITUDE MODULATION CIRCUIT

Philip H. Peters, Jr., Schenectady, N. Y., assignor to General Electric Company, a corporation of New York Application May 10, 1950, Serial No. 161,053

3 Claims. (Cl. 332—37)

My invention relates to amplitude modulation circuits and more particularly to such circuits in which the high frequency oscillator is directly modulated.

In general, the practice of amplitude modulating a vacuum tube oscillator is avoided because of the inherent frequency modulation thereby produced. Where size and weight per watt generated are important factors, however, a modulated oscillator is oftentimes tolerated such, for example, as in walkie-talkie sets, radio sonde and other portable work. Because ordinary receivers do not have sufficient band width to accommodate the signals from such devices and because a super regenerative detector is generally required, frequency drift in signals from walkie-talkies, etc., has not been too objectionable. Of course, as the use of frequency bands where such communication is carried on increases, greater frequency stability will be demanded. A quartz crystal oscillator will still be excluded, however, because of the complexity and increased size encountered in its use.

Therefore, an object of my invention is to provide an amplitude modulating electronic circuit in which a high frequency oscillator is directly amplitude modulated without the introduction of frequency modulation components.

Another object of my invention is to provide an electronic oscillator which may be directly amplitude modulated without the production of frequency modulation, without the frequency drift inherent in most directly modulated oscillators, and which may be built in a compact unit.

In the attainment of the foregoing objects, I employ an electron-coupled oscillator having a parallel resonant circuit, which is known in the art as a tank circuit, interconnected between the screen grid and the control grid of the oscillator electronic valve. The modulating signal is amplified by a conventional modulator tube and supplied to the oscillator by a transformer. The modulator tube in conjunction with its phase changing circuit also performs the function of a reactance tube and thereby presents a variable reactance to the tank circuit of the oscillator.

A modulation signal of increased positive amplitude at the tank circuit of the oscillator increases the frequency of oscillation unless some means of compensation is employed. In my modulating circuit, the reactance tube automatically compensates for this oscillator frequency change because the reactance presented by the reactance tube to the tank circuit is dependent upon the amplitude of the modulation signal in a compensating manner. The reactance presented to the oscillator tank circuit by the reactance tube is also such that changes in oscillator frequency due to changes in plate voltage and heating current are compensated for, whereby a constant oscillator frequency is maintained.

For additional objects and advantages and for a better understanding of my invention, attention is now directed to the following description and accompanying drawing and also to the appended claims in which the features of my invention believed to be novel are particularly pointed out. In the drawing, the figure is a schematic electric diagram of an amplitude modulation circuit.

Referring to the drawing, an oscillator circuit 1 comprises a pentode electronic valve 2, a tank circuit including an inductor 3 and a variable capacitor 4, and a capacitor 5 which is connected between the control grid of valve 2 and a junction between capacitor 4 and inductor 3. The other junction between capacitor 4 and inductor 3 is directly connected to the screen electrode of valve 2, and a grid leak resistor 6 is connected between the control electrode and the cathode of valve 2. A combination modulator and reactance tube 7 has a high frequency choke coil 8 and a primary winding of a transformer 9 serially connected between its anode and a direct voltage source (not shown in the drawing), and also has a variable cathode resistor 10 interconnected between its cathode and ground. A capacitor 11 by-passes the primary winding of transformer 9, and a capacitor 12 by-passes resistor 10 for high frequency currents. The control grid of tube 7 is connected to ground through a resistor 13 and is connected to the anode of tube 7 through a capacitor 14. A resistor 15 is interconnected between the signal grid of tube 7 and ground, the screen grids of tube 7 are connected to a source of direct voltage, and the suppressor grid and the cathode of tube 7 are connected together. The secondary winding of transformer 9 is interconnected between the direct voltage source and a tap 16 on inductor 3. Tap 16 is by-passed to ground for high frequency currents by a capacitor 17, and a capacitor 18 is a high frequency coupling capacitor connected between the anode of tube 7 and a tap 19 and inductor 3. A high frequency choke coil 20 is serially connected between the anode of tube 2 and the direct voltage source, and the output of this circuit appears between the anode of tube 2 and ground.

Oscillator 1 is a conventional Hartley oscillator circuit in which the screen electrode of valve 2 performs a function equivalent to that function performed by the anode of a triode Hartley oscillator, and the frequency of oscillation is dependent upon the screen direct voltage and the resonant frequency of the tank circuit which includes inductor 3 and capacitor 4 and the reactance of tube 7 appearing across a portion of inductor 3. The modulating signal which is supplied across resistor 15 and thus to the signal grid of tube 7 is amplified by tube 7 and coupled through transformer 9 to tap 16. This modulating signal appearing at tap 16 varies the screen grid potential of valve 2 and amplitude modulates the high frequency signal from the oscillator. As is known in the art, however, as the screen potential of an electron-coupled oscillator such as this is varied in potential, not only the amplitude of the high frequency output wave is varied but the frequency of the output is also varied at a frequency related to the frequency of the modulating signal. Consequently, the output has both amplitude and frequency modulation components which is generally undesirable.

The capacitance appearing between tap 19 and ground is primarily that presented by reactance tube 7 and has a value as determined by the following equation:

$$C = g_m R C_{14}$$

in which:

$g_m$ is the mutual conductance of tube 7.
R is the resistance of resistor 13.
$C_{14}$ is the capacitance of capacitor 14.

Because the mutual conductance of tube 7 increases with an increased signal on its signal grid, the capacitance paralleling a portion of inductor 3 varies simultaneously and increases with an increase in the modulating signal. This increased capacitance appearing across a portion of inductor 3 lowers the resonant frequency of the tank circuit of oscillator 1 and thus may reduce the frequency such as to compensate for any frequency shift due to the magnitude of the modulating signal being fed to the oscillator at tap 16. Because this is a dynamic type of frequency compensation, compensation occurs throughout the entire modulating cycle. Transformer 9 has been incorporated into this circuit to maintain an in-phase relationship between the modulating signal and the tank circuit voltage of oscillator 1. High frequency choke coil 8 prevents any high frequency signal from being fed to transformer 9, and high frequency choke coil 20 is utilized to produce thereacross a high frequency voltage dependent upon the signal on the screen electrode of valve 2. Resistor 10 and the taps on inductor 3 are variable such that the proper amount of compensation required may be obtained for various operating conditions. It should be understood, however, that circuit parameters other than these may be used to control the amount of frequency compensation. Capacitor 4 is also variable and is used to adjust the center frequency of oscillator 1.

An increase in supply voltage, which would ordinarily cause the frequency of oscillator 1 to increase, causes the mutual conductance of tube 7 to increase and thereby decreases the frequency of the resonant tank circuit to maintain the high frequency output signal from valve 2 constant. Variations in filament supply voltage are similarly compensated for within, of course, a practical range.

The output signal of this modulator oscillator is therefore amplitude modulated without the introduction of any frequency modulation components, and the oscillator is inherently stable as to variations in anode and filament supply voltages. A modulator amplifier such as tube 7 is generally required in any such equipment in which an oscillator is directly amplitude modulated and, therefore, the size of equipment employing this oscillator is not materially increased. This makes the circuit particularly adaptable to compact units in which frequency stability is a requirement.

This disclosure has been described by means of a particular circuit arrangement. However, there are several other circuit arrangements in which an amplitude modulator tube circuit may be designed to automatically compensate for any inherent frequency change caused by variations in the amplitude of filament supply voltage, anode supply voltage and modulating signal voltage. It will, therefore, be understood that various modifications may be made without departing from the invention. The appended claims are, therefore, intended to cover any such modifications which fall within the true spirit and scope of the invention.

What I claim as new and desire to secure by Letters Patent of the United States is:

1. An amplitude modulating circuit comprising a first electron discharge device having an anode, a cathode, a control electrode, a screen electrode and a suppressor electrode, said cathode being directly connected to ground, a resistor being interconnected between said control electrode and ground, a parallel resonant tank circuit consisting of an inductor and a first capacitor, a second capacitor, one junction of said inductor and said first capacitor being electrically connected to said screen electrode and another junction of said first capacitor and said inductor being connected through said second capacitor to said control electrode, a source of direct voltage, a choke coil being interconnected between said source of direct voltage and said anode, a transformer having a primary and secondary winding, said secondary winding being interconnected between said source of direct voltage and a first tap on said inductor, a capacitor interconnected between said first tap and ground; a second electron discharge device having an anode, a cathode, a control electrode, a pair of screen electrodes, a suppressor electrode, and a signal electrode; a first resistor and a third capacitor being serially connected between the anode of said second electron discharge device and ground, the junction of said first resistor and said third capacitor being electrically connected to the control electrode of said second device, a second resistor and a fourth capacitor being connected in parallel between the cathode of said second device and ground, a choke coil and the primary winding of said transformer being serially connected between said source of direct voltage and the anode of said second device, a resistor being interconnected between said signal electrode and ground, a capacitor being connected across the primary winding of said transformer, a capacitor interconnected between the anode of said second device and a second tap on said first inductor, an alternating voltage being supplied to said signal electrode whereby a high frequency voltage appearing between the anode of said first device and ground is amplitude modulated by said alternating voltage.

2. A circuit for supplying an amplitude modulated output signal comprising an electronic oscillator circuit having an output frequency and amplitude dependent upon the energizing voltage for said oscillator, said oscillator including a tank circuit the parameters of which determine the output frequency of said oscillator at a given energizing voltage, and means for amplitude modulating said oscillator including a modulator-reactance electronic valve connected to vary the energizing voltage for said oscillator in response to an input signal whereby the output of said oscillator will be both amplitude and frequency modulated, said valve being also connected to vary simultaneously the parameters of said tank circuit to compensate for the frequency modulation of the output of said oscillator.

3. In an amplitude modulator, an oscillator having a resonant tank circuit, an amplifying circuit comprising an electron discharge device having an anode, a cathode and a signal electrode, the mutual conductance of said discharge device being dependent upon the amplitude of an input modulating signal and the output reactance of said amplifying circuit being dependent upon the mutual conductance of said discharge device, a phase-changing circuit connected in circuit with the anode and cathode of said discharge device, means interconnecting the output of said amplifying circuit and said resonant tank circuit comprising means interconnecting said phase-changing circuit and said resonant tank circuit, and means for supplying a modulating signal to said signal electrode whereby the output of said oscillator is amplitude modulated but not frequency modulated by said modulating signal.

PHILIP H. PETERS, Jr.

References Cited in the file of this patent

UNITED STATES PATENTS

| Number | Name | Date |
|---|---|---|
| 2,056,167 | Crooks | Oct. 6, 1936 |
| 2,382,198 | Bollinger | Aug. 14, 1945 |
| 2,408,192 | Bell et al. | Sept. 24, 1946 |
| 2,461,642 | Hayes | Feb. 15, 1949 |
| 2,556,883 | Moe | June 12, 1951 |